(12) United States Patent
Wilson

(10) Patent No.: US 6,787,876 B2
(45) Date of Patent: Sep. 7, 2004

(54) SEMICONDUCTOR DEVICE

(75) Inventor: Martin Clive Wilson, Wiltshire (GB)

(73) Assignee: Zarlink Semiconductor Limited, Wiltshire (GB)

( * ) Notice: Subject to any disclaimer, the term of this patent is extended or adjusted under 35 U.S.C. 154(b) by 0 days.

(21) Appl. No.: 09/954,691

(22) Filed: Sep. 12, 2001

(65) Prior Publication Data
US 2003/0122215 A1 Jul. 3, 2003

(30) Foreign Application Priority Data
Sep. 12, 2000 (GB) .............................................. 0022329

(51) Int. Cl.[7] .............................................. H01L 29/06
(52) U.S. Cl. ........................ 257/520; 257/508; 257/513
(58) Field of Search ................................ 257/520, 508, 257/513

(56) References Cited
U.S. PATENT DOCUMENTS 5,459,346 A  * 10/1995 Asakawa et al. ........... 257/347
5,889,314 A  *  3/1999 Hirabayashi ................ 257/508
6,492,684 B2 * 12/2002 Bolam et al. ............... 257/349
6,555,891 B1 *  4/2003 Furukawa et al. .......... 257/505

* cited by examiner

Primary Examiner—Jerome Jackson
(74) Attorney, Agent, or Firm—Pearne & Gordon LLP

(57) ABSTRACT

A semiconductor device comprises a substrate (11) having an insulating layer (12) formed on a surface thereof, and a silicon layer (13) located on a surface of the insulating layer. A trench (14) extends from a surface of the silicon layer (13) through the insulating layer (12) and into the substrate (11). An insulating liner (14a) is located on the side walls and the base of the trench (14), and an in-fill (14b) of thermally-conductive material is formed within the insulating liner. The insulating liner (14a), the in-fill material (14b) and the distance over which the trench 14) extends into the substrate (11) are such as to promote flow of heat from the silicon layer (13) to the substrate.

14 Claims, 1 Drawing Sheet

SEMICONDUCTOR DEVICE

BACKGROUND OF THE INVENTION

This invention relates to a semiconductor device, and in particular to a semiconductor device having a silicon-on-insulator (SOI) structure.

A SOI structure typically is constituted by a first and second silicon layers separated by a silicon oxide layer. In a first form of SOI structure, a single crystal silicon film is formed on a silicon substrate on whose surface is deposited an insulating film of silicon oxide. In a second form of structure, a silicon oxide film is formed at a small depth from the surface of a single crystal silicon substrate. In a third form of SOI structure, a single crystal silicon plate is thermocompression bonded to a substrate which has a silicon oxide film on its surface.

The main advantage of SOI technology is that it has a reduced power consumption when compared with known technologies. One trend in VLSI microelectronics over the last few years has been the incorporation of integrated circuits with ever greater complexity and ever greater power consumption. Increased power consumption can impose serious limitations on the use of integrated circuits, for example, portable applications. Even though the trend in recent years has been to use low power complementary metal oxide silicon (CMOS) technology on bulk silicon combined with power management techniques, power consumption remains an issue. SOI technology offers a further reduction in power consumption, and for this reason is an attractive technology for future mainstream VLSI products. In RF applications, particularly mobile communications, bipolar technology is prevalent because of its ability to operate at high frequencies. In these applications, power consumption can be relatively high. Again, SOI technology offers a reduction in power consumption and for this reason is an attractive technology for future mobile communication products. SOI technology offers improvements in junction area, leakage, isolation and capacitance, and leads to reduced power consumption when compared to bulk devices.

Unfortunately, SOI technology is not without drawbacks. Thus, the presence of a buried oxide reduces thermal conductivity to the substrate. Consequently, heat dissipation is reduced, and this can limit the operating performance of the device concerned, particularly in applications where current handling is important.

Where SOI technology is used in VLSI products, each of the semiconducting devices forming such a product requires isolation. A common form of isolation, in both bulk and SOI technology, is that of trench isolation. In SOI technology, the combination of trench isolation and the buried oxide results in electrically isolated "tubs" in which the active devices are formed. For good electrical isolation, the trench depth must equal the upper layer thickness, i.e. the trench must reach the buried oxide. Failure to do so would result in a leakage path between tubs. A typical layer thickness above the buried oxide is 2–3 $\mu$m, and the trench needed is regarded as "shallow".

FIG. 1 shows a typical form of isolation for SOI technology. FIG. 1 shows a part of a VLSI SOI device, the device being constituted by a silicon substrate 1, a silicon oxide (buried oxide) layer 2 and a surface layer of silicon 3. A plurality of trenches 4 (only two of which are shown) are formed in the device, each trench being constituted by a dielectric liner 4a and a polysilicon in-fill 4b. Each pair of adjacent trenches 4 defines a tub 3a in the surface layer 3 of silicon. A semiconductor device (not shown) can then be formed in each of the tubs 3a.

The trenches 4 provide good electrical isolation for each of the tubs 3a. Unfortunately, the good electrical isolation of the tubs 3a is accompanied by good thermal isolation; and, as mentioned above, this leads to a reduction in heat dissipation, and possibly a limiting of the operating performance of the devices concerned. This problem is particularly important in bipolar and bipolar CMOS technologies, but the problem can also arise with high density CMOS devices.

In an attempt to reduce thermal isolation, the inclusion of thermally-conducting pillars directly to contact the substrate is expected to improve heat dissipation. Similarly, extending trenches just into the substrate layer, and to remove the base portions of the dielectric liners so that the trench in-fill material contacts the substrate layer, is expected to improve heat dissipation. However, there are several disadvantages with both these approaches. In the first case, there is the need to introduce extra processing to produce the pillar, and to incorporate the pillar in such a way so that it does not electrically connect the device with the substrate. In the second case, there is the need to introduce extra processing to remove only specific parts of the dielectric liner material without damaging the remaining liner. Both necessitate increased processing time, more complex processing and higher costs.

BRIEF SUMMARY OF THE INVENTION

The present invention provides a semiconductor device comprising a substrate having an insulating layer formed on a surface thereof, a semiconductor material layer located on a surface of the insulating layer, a trench that extends from a surface of the semiconductor material layer through the insulating layer and into the substrate, an insulating liner located on the side walls and the base of the trench, and an in-fill of thermally-conductive material within the insulating liner, wherein the insulating liner, the in-fill material and the distance over which the trench extends into the substrate are such as to promote flow of heat from the semiconductor material layer to the substrate, the insulating liner completely surrounding the in-fill material at least where the trench extends into the substrate, and said distance is at least 1 $\mu$m.

Advantageously, said distance lies within the range of from 1 $\mu$m to 5 $\mu$m, and preferably within the range of from 3 $\mu$m to 5 $\mu$m.

In a preferred embodiment, there are two trenches, each of which has the features defined above, and wherein an active device is formed in the semiconductor material layer between the two trenches. More preferably, there are a plurality of trenches, each of which has the features defined above, and wherein a respective active device is formed in the semiconductor material layer between each pair of adjacent trenches.

Preferably, the semiconductor material layer is a silicon layer, more preferably a silicon layer of single crystal formation.

Advantageously, the substrate is a silicon substrate, and the insulating layer is a silicon oxide layer.

Preferably, the or each liner is constituted by an outer layer of silicon oxide and an inner layer of silicon nitride, and the or each outer silicon oxide layer has a thickness of substantially 1,000 Å°, and the or each inner silicon nitride layer has a thickness of substantially 300 Å°.

Conveniently, the in-fill material is polysilicon, and the width of the or each trench is substantially 0.8 $\mu$m.

Preferably, the thickness of the or each liner is at least an order of magnitude less than the thickness of the insulating layer.

DETAILED DESCRIPTION OF THE INVENTION

The invention will now be described in greater detail, by way of example, with reference to FIG. 2 of the drawings which shows part of a VLSI SOI device constructed in accordance with the invention.

Figure 2:
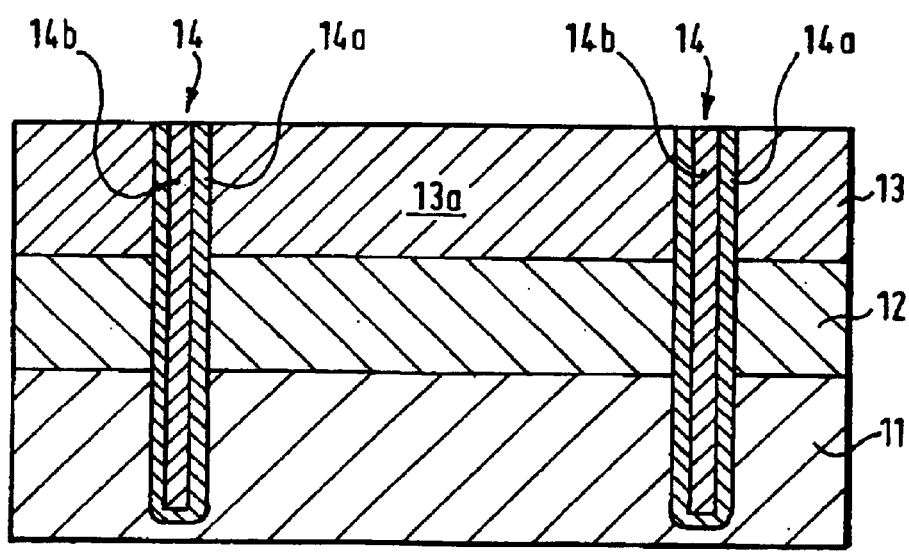
FIG. 2 is a sectional view of a part of a VLSI SOI device according to the present invention.

FIG. 2 shows part of a VLSI SOI device, the device being constituted by a silicon substrate 11, a silicon oxide (buried oxide) layer 12 and a surface layer 13 constituted by a single crystal formation of silicon. A plurality of trenches 14 (only two of which are shown) are formed in the device, each trench being constituted by a dielectric liner 14a and a polysilicon in-fill 14b. Each pair of adjacent trenches 14 defines a tub 13a in the surface layer 13 of silicon. A semiconductor device (not shown) can then be formed in each of the tubs 13a.

Each of the trenches 14 is formed by dry etching a respective trench in the device from the upper surface of the layer 13. A liner 14a is then formed in each of the trenches, each liner being constituted by a 1,000 Å silicon oxide layer thermally grown within that groove, and then by a 300 Å silicon nitride layer deposited within the oxide layer. Polysilicon is then deposited within each of the liners 14a to complete the trenches 14. Each of the trenches 14 has a width of 0.8 $\mu$m, so that each polysilicon in-fill has a width of 0.54 $\mu$m.

Figure 1:
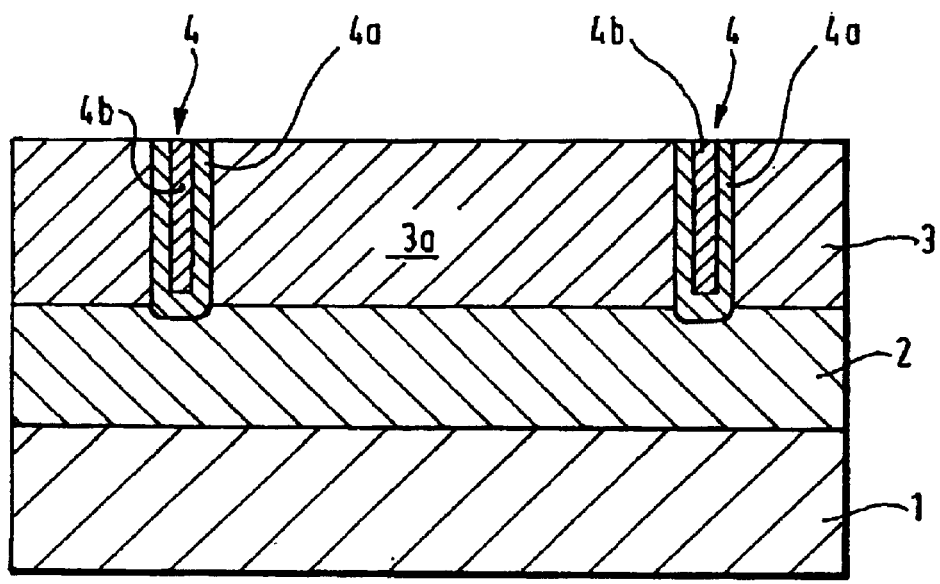
FIG. 1 is a sectional view of a part of a very large scale integration (VLSI) silicon-on-insulator (SOI) device according to the prior art.

By comparing the devices shown in FIGS. 1 and 2, it will be apparent that the trenches 14a are considerably deeper than the trenches 4. Thus, the trenches 14 have a depth of 7±0.5 $\mu$m, the surface layer 13 (in common with the surface layer 3 of the device of FIG. 1) being 2.5 $\mu$m, and the buried oxide layer 12 (in common with the buried oxide layer 2 of FIG. 1) being 1±0.1 $\mu$m in thickness. Consequently, the trenches 14 extend into the substrate 11 by distance of 3.0 $\mu$m. This order of trench penetration into the substrate 11 is necessary to ensure sufficient heat is transported across the dielectric liners 14a.

Heat conduction to the substrate 11 is dependent upon the depth and surface area of each of the trenches 14 in the substrate region. The material of the in-fills 14b, and the thickness of the liners 14a are also factors in the rate of heat conduction to the substrate. As the in-fill material is significant to heat dissipation, polysilicon is preferable to oxide for this material, though other (and preferably better conductive materials) may also be used. As heat must be transported across the dielectric liners 14a, the thickness of these liners must be at least an order of magnitude less than that of the buried oxide layer 12. In practice, each of the trenches 14 should extend into the substrate 11 by at least 1 $\mu$m. Typically, a depth extension into the substrate 11 of between 3 $\mu$m and 5 $\mu$m is used.

The semiconductor device could be modified in a number of ways. For example the substrate 11 could be of a material other than silicon, for example sapphire, the buried oxide layer 12 could be a layer of another material of good insulating properties, for example silicon nitride, and the single crystal surface layer 13 could be a silicon alloy containing up to about 10% of, say, germanium.

As mentioned above, the depth and surface area of each of the trenches 14 in the substrate region 11 is important, and these parameters are given above for the particular device shown. It will be apparent, however, that these parameters will vary for different devices, but it will be appreciated that owing to the good thermal isolation provided by the liners 14a, the trenches 14 must always extend a considerable distance into the substrate layer 11, even when the thickness of the liners is of the order described above.

The semiconductor device of the invention is such as to promote thermal dissipation from an active semiconductor device to the substrate of an SOI structure using an etched trench filled with polycrystalline silicon. Moreover, the integrity of the dielectric lining of the trench (which is necessary for electrical isolation) is maintained, without the need for any extra processing steps over and above those required for the electrical function. Controlling the depth of the trench penetrates into the SOI substrate, and thereby controlling the trench/SOI substrate surface area, influences thermal dissipation.

What is claimed is:

1. A semiconductor device comprising a substrate having an insulating layer formed on a surface thereof, a semiconductor material layer located on a surface of the insulating layer, a trench that extends from a surface of the semiconductor material layer through the insulating layer and into the substrate, an insulating liner located on the side walls and the base of the trench, and an in-fill of thermally-conductive material within the insulating liner, wherein the insulating liner, the in-fill material and the distance over which the trench extends into the substrate are such as to promote flow of heat from the semiconductor material layer to the substrate, the insulating liner completely surrounding the in-fill material at least where the trench extends into the substrate, and said distance is at least 1 $\mu$m.

2. A semiconductor device is claimed in claim 1, wherein said distance lies within the range of from 1 $\mu$m to 5 $\mu$m.

3. A semiconductor device is claimed in claim 2, wherein said distance lies within the range of from 1 $\mu$m to 5 $\mu$m.

4. A semiconductor device as claimed in any one of claims 1 to 3, wherein there are two trenches, each of which has the features defined in claim 1, and wherein an active device is formed in the semiconductor material layer between the two trenches.

5. A semiconductor device as claimed in any one of claims 1 to 3, wherein there are a plurality of trenches, each of which has the features defined in claim 1, and wherein a respective active device is formed in the semiconductor material layer between each pair of adjacent trenches.

6. A semiconductor device as claimed in any one of claims 1 to 3, wherein the semiconductor material layer is a silicon layer.

7. A semiconductor device as claimed in claim 6, wherein the silicon layer is of single crystal formation.

8. A semiconductor device as claimed in any one of claims 1 to 3, wherein the substrate is a silicon substrate.

9. A semiconductor device as claimed in any one of claims 1 to 3, wherein the insulating layer is a silicon oxide layer.

10. A semiconductor device as claimed in any one of claims 1 to 3, wherein the or liner is constituted by an outer layer of silicon oxide and an inner layer of silicon nitride.

11. A semiconductor device as claimed in claim 10, wherein the outer silicon oxide layer has a thickness of substantially 1,000 Å, and the inner silicon nitride layer has a thickness of substantially 300 Å.

12. A semiconductor device as claimed in any one of claims 1 to 3, wherein the in-fill material is polysilicon.

13. A semiconductor device as claimed in claim 12, wherein the width of the trench is substantially 0.8 μm.

14. A semiconductor device as claimed in any one of claims 1 to 13, wherein the thickness of the liner is at least an order of magnitude less than the thickness of the insulating layer.

* * * * *

UNITED STATES PATENT AND TRADEMARK OFFICE
CERTIFICATE OF CORRECTION

PATENT NO. : 6,787,876 B2
DATED : September 7, 2004
INVENTOR(S) : Martin Clive Wilson It is certified that error appears in the above-identified patent and that said Letters Patent is hereby corrected as shown below:

Column 4,
Line 43, after "from" please delete "1" and insert therefor -- 3 --.

Signed and Sealed this

Twenty-fifth Day of January, 2005

JON W. DUDAS
*Director of the United States Patent and Trademark Office*